(12) United States Patent
D'Souza et al.

(10) Patent No.: US 12,744,461 B2
(45) Date of Patent: Sep. 22, 2026

(54) POWER STAGE PROVIDING HIGHER MAGNITUDE CURRENT IN A SWITCHING CONVERTER

(71) Applicant: Shaoxing Yuanfang Semiconductor Co., Ltd., Shaoxing (CN)

(72) Inventors: Arnold J D'Souza, Bangalore (IN); Shyam Somayajula, Bangalore (IN)

(73) Assignee: Ningbo Aura Semiconductor Co., Ltd, Ningbo (CN)

( * ) Notice: Subject to any disclaimer, the term of this patent is extended or adjusted under 35 U.S.C. 154(b) by 186 days.

(21) Appl. No.: 18/744,721

(22) Filed: Jun. 17, 2024

(65) Prior Publication Data

US 2025/0158526 A1 May 15, 2025

(30) Foreign Application Priority Data

Nov. 14, 2023 (IN) ............................ 202341077360

(51) Int. Cl.
*H02M 3/158* (2006.01)
*H02M 1/00* (2006.01)
(Continued)

(52) U.S. Cl.
CPC ......... *H02M 3/158* (2013.01); *H02M 1/0009* (2021.05); *H02M 1/0012* (2021.05); *H02M 1/08* (2013.01); *H03K 19/215* (2013.01)

(58) Field of Classification Search
CPC .. H02M 3/158; H02M 1/0009; H02M 1/0012; H02M 1/08; H03K 19/215
See application file for complete search history.

(56) References Cited

U.S. PATENT DOCUMENTS 8,710,810 B1 * 4/2014 McJimsey ............. H02M 3/158 323/283
2020/0091819 A1 * 3/2020 Kobayashi ............ H02M 1/088
(Continued)

FOREIGN PATENT DOCUMENTS

CN 114667673 A 6/2022

OTHER PUBLICATIONS

Yat Tam, Powering Datacenters with Digital Multi-Phase Controllers, https://www.monolithicpower.com/en/powering-datacenters-with-digital-multi-phase-controllers, Jun. 22, 2022, Article #0047 Rev. 1.0, 5 Pages, MPS Proprietary Information.

*Primary Examiner* — Rafael O De Leon Domenech
(74) *Attorney, Agent, or Firm* — IPHORIZONS PLLC; Narendra Reddy Thappeta

(57) ABSTRACT

A switching converter includes a power stage and a controller. The power stage drives a current through an inductance in a duration specified by a control signal. The phase controller generates the control signal to cause the power stage to generate a regulated supply voltage. The power stage is designed to communicate with the phase controller on a path. The power stage includes a first sub-stage and a second sub-stage that respectively drive a first sub-current and a second sub-current via corresponding inductors in response to the control signal. The corresponding inductors together operate to provide the inductance. The path is used for communication between the first sub-stage and the phase controller, and then between the second sub-stage and the phase controller in alternate cycles of the control signal.

20 Claims, 8 Drawing Sheets

(51) Int. Cl.

| | |
|---|---|
| ***H02M 1/08*** | (2006.01) |
| ***H03K 19/21*** | (2006.01) |

(56) References Cited

U.S. PATENT DOCUMENTS

| | | | | |
|---|---|---|---|---|
| 2020/0321872 | A1 | 10/2020 | Upadhyaya | |
| 2022/0393464 | A1* | 12/2022 | Venugopal ............ | H02M 3/285 |
| 2022/0399815 | A1 | 12/2022 | Cheung et al. | |
| 2023/0091808 | A1 | 3/2023 | Philbrick et al. | |
| 2023/0188028 | A1 | 6/2023 | Wu et al. | |
| 2023/0238882 | A1 | 7/2023 | Soleno et al. | |

* cited by examiner

POWER STAGE PROVIDING HIGHER MAGNITUDE CURRENT IN A SWITCHING CONVERTER

PRIORITY CLAIM

The instant patent application is related to and claims priority from the co-pending provisional India patent application entitled, "SPS Doubler Configuration Current Balancing", Ser. No. 202341077360, Filed: 14 Nov. 2023; which is incorporated in its entirety herewith to the extent not inconsistent with the description herein.

BACKGROUND

Technical Field

Embodiments of the present disclosure relate generally to power supply circuits, and more specifically to a power stage providing higher magnitude current in a switching converter

Related Art

A switching converter refers to a component which generates a regulated DC (direct current) voltage from an input power source by employing one or more switches, as is well known in the relevant arts. Switching converters are used in devices such as computers and mobile phones, as is also well known in the relevant arts.

A power stage is an integral block of a switching converter, and contains a pair of power switches driving an inductor. Each power switch (switch) is typically implemented as a transistor (e.g., MOSFET) and the switches are connected in series between an input supply source and a reference terminal (e.g., ground). The switch coupled closer to the input voltage (source of input power to the converter) is termed as the high-side switch, while the other one is termed as a low-side switch.

The switches are operated by a control circuit which switches ON the transistors in successive non-overlapping time durations to cause the switch that is currently ON to drive the inductor in the corresponding duration. In effect, a switching converter transforms the voltage (input supply voltage) of the input power source into a pulsed voltage by operating the switch(es), the pulsed voltage then being regulated and smoothed using capacitors and/or other elements to generate the regulated DC voltage.

There is often a need to have power stages capable of providing higher magnitude currents. However, such power stages may need to be backward compatible with phase controllers, which are already designed with pre-specified signals/pins. Aspects of the present disclosure are directed to such power stages providing higher magnitude current in a switching converter.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A switching converter provided according to an aspect of the present disclosure includes a power stage and a controller. The power stage drives a current through an inductance in a duration specified by a control signal. The phase controller generates the control signal to cause the power stage to generate a regulated supply voltage. The power stage is designed to communicate with the phase controller on a path. The power stage includes a first sub-stage and a second sub-stage that respectively drive a first sub-current and a second sub-current via corresponding inductors in response to the control signal. The corresponding inductors together operate to provide the inductance. The path is used for communication between the first sub-stage and the phase controller, and then between the second sub-stage and the phase controller in alternate cycles of the control signal.

In an embodiment, the path is used to communicate a magnitude of current provided by the power stage. Each of the first sub-stage and the second sub-stage is designed to indicate twice a magnitude of the first sub-current and the second sub-current respectively in the corresponding alternate cycles.

According to another aspect of the present disclosure, each of the first sub-stage and the second sub-stage includes a comparison circuit and a modulation circuit. The comparison circuit compares magnitudes of the corresponding currents indicated by the first sub-stage and the second sub-stage. The modulation circuit receives the control signal, and generates an adjusted control signal based on a result of the comparison. The adjusted control signal has an adjusted duration to equalize the magnitudes of the first sub-current and the second sub-current. The respective adjusted control signals in the first sub-stage and the second sub-stage cause the first sub-stage and the second sub-stage to respectively drive the first sub-current and the second sub-current via the corresponding inductors in response to the control signal.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example System

Figure 1:
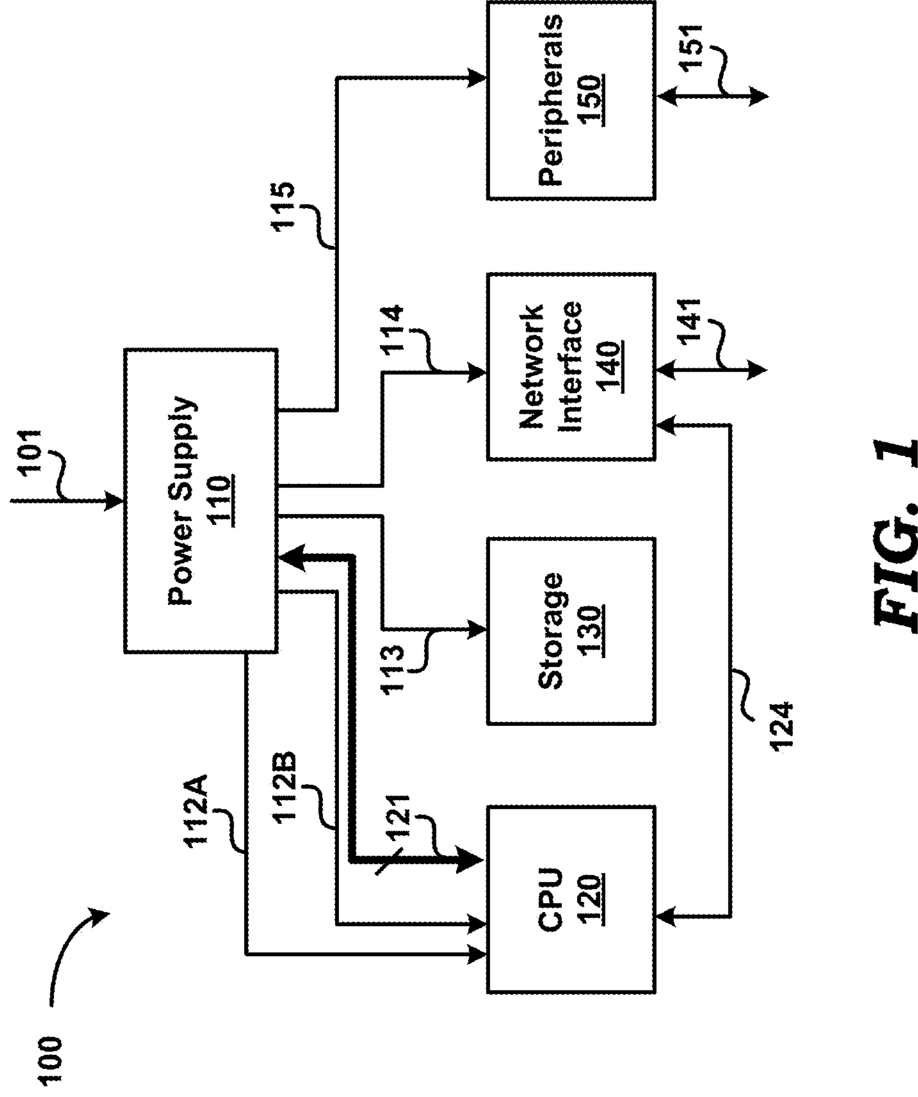
FIG. 1 is a block diagram of an example system in which several aspects of the present disclosure can be implemented.

FIG. 1 is a block diagram of an example system in which several aspects of the present disclosure can be implemented. System 100 is shown containing power supply 110, central processing unit (CPU) 120, storage 130, network interface 140 and peripherals 150. In an embodiment, system 100 corresponds to a computer (desktop, laptop, etc.), although system 100 can represent other types of systems in other embodiments. It is understood that system 100 can contain more or fewer blocks than those shown in FIG. 1.

CPU 120, in general, represents a processor or a system-on-chip (SoC), and is shown as receiving a pair of supply voltages (Va and Vb) on respective paths 112A and 112B from power supply 110. As an example, Va may be a smaller voltage than Vb, and may be used to power a core portion of CPU which may include arithmetic logic unit (ALU), microprogram sequencer, registers, etc. Vb may be used to power the rest of CPU 120, such as for example, input/output (I/O) units, I/O buffers, on-chip peripherals etc. CPU 120 provides various signals (all deemed to be contained in bidirectional path/bus 121) specifying, among others, its power supply requirements to power supply 110. Examples of such signals can be those that specify the specific mode of operation (in terms of power consumption) such as PS1, PS2, PS3, etc., which refer to "Power Save States for Improved Efficiency". CPU 120 receives health information of the power stages from phase controller 210 via bidirectional path/bus 121.

Storage 130 represents a memory that may include both volatile and non-volatile memories. For example, in a personal computer, storage can include magnetic memory (hard disk) as well as solid state memory (RAM, Flash, etc.). Storage 130 is shown receiving a supply voltage on path 113 for powering various circuits and blocks within.

Network interface 140 operates to provided two-way communication between system 100 and a computer network, or in general the Internet. Network interface 140 implements the electronic circuitry required to communicate using a specific physical layer and data link layer standard such as Ethernet or Wi-Fi™. Network interface 140 may also contain a network protocol stack to allow communication with other computers on a same local area network (LAN) and large-scale network communications through routable protocols, such as Internet Protocol (IP). Network interface 140 receives a power supply on path 114 for powering internal circuits and blocks. Network interface 140 receives from/transmits to external systems and CPU 120 respectively on path 141 and path 124.

Peripherals 150 represents one or more peripheral circuits, such as for example, speakers, microphones, user interface devices, etc. Peripherals 150 receives a power supply on path 115, and communicates with external devices on path 151.

Power supply 110 receives power from one or more sources (e.g., battery) on path 101, and operates to provide the desired power supply voltages on paths 112A, 112B, 113, 114 and 115. In an embodiment, power supply 110 is designed to contain one or more multi-phase DC-DC converters within to generate the power supply voltages. Power supply 110 receives signals from CPU 120 received on path 121 that may indicate power-modes in which CPU 120 is to operate in a particular duration, with the power-modes representing a magnitude of power that CPU 120 is likely to require/consume from power supply 110. Power supply 110 responds to the signals by controlling the multi-phase converter(s) to reduce/increase current output based on the specific power-mode signal (e.g., PS1, PS2 and PS3).

In an embodiment, power supply 110 is a voltage regulator module (VRM), sometimes also called processor power module (PPM), and contains one or more step-down switching (buck) converters to generate one or more smaller voltages from a higher-voltage supply source. In other embodiments however, other types of DC-DC converters such as boost, buck-boost, hysteretic converters etc., can be implemented instead of a buck converter. Further, power supply 110 can be implemented as a standalone switching converter with only one power stage (and therefore not be a multi-phase converter). With a VRM, multiple devices/ICs requiring different supply voltages can be mounted on the same platform, for example, a computer motherboard of a personal computer (PC).

Figure 2:
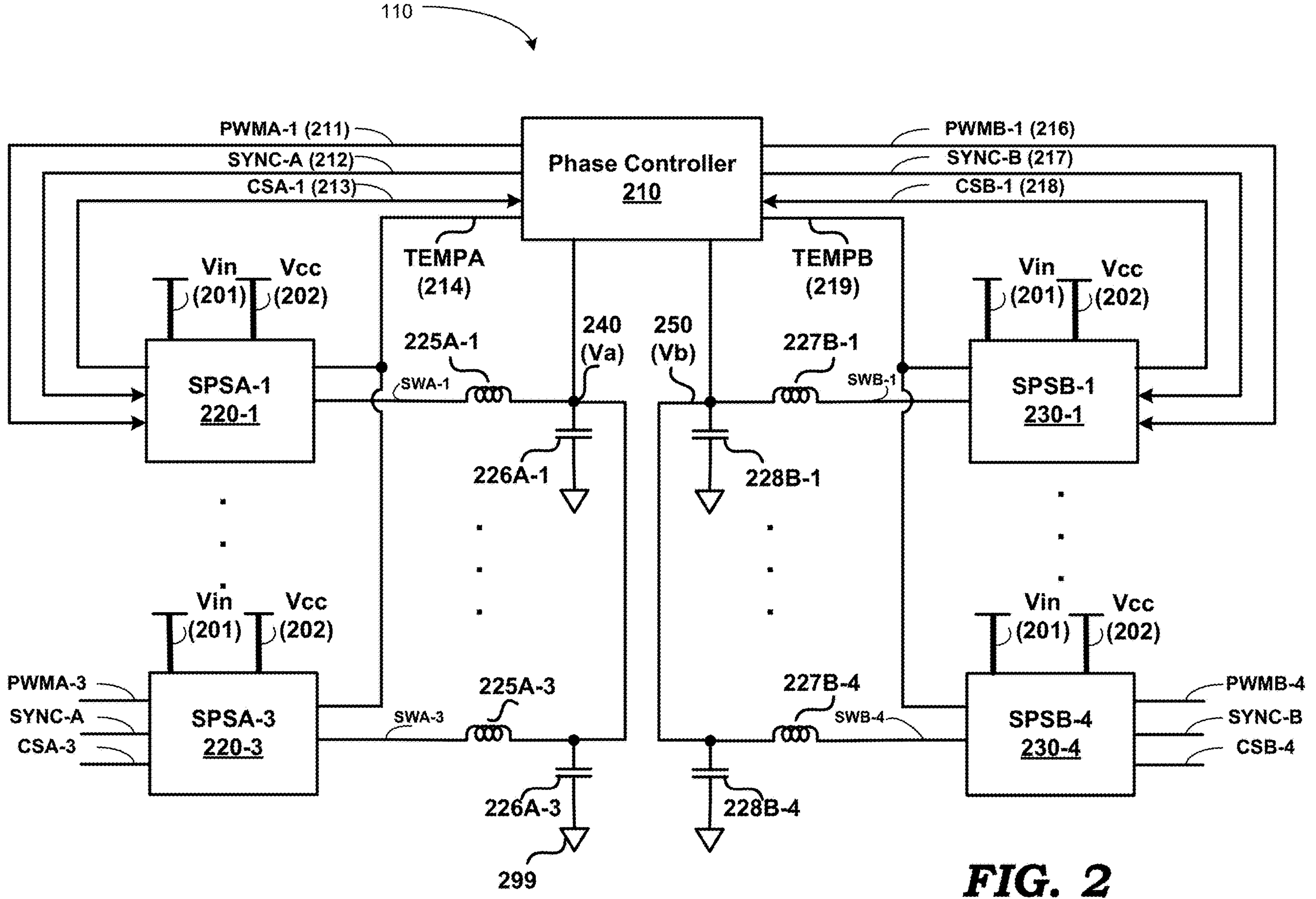
FIG. 2 is a block diagram illustrating the details of a voltage regulation module (VRM) in an embodiment of the present disclosure.

The description is continued with respect to the internal details of a VRM as shown in FIG. 2.

3. Voltage Regulator Module (VRM)

FIG. 2 is a block diagram illustrating the details of a VRM in an embodiment of the present disclosure. Power Supply 110 (of FIG. 1) is a Voltage Regulator Module implemented in the form of a multi-phase switching converter generating two regulated voltages, i.e., two supply rails (power rails), namely Va (240) (Rail-A) and Vb (250) (Rail-B). Nodes 240 and 250 may respectively be also viewed as the power rails. In FIG. 2, the supply source used for deriving/generating Va and Vb is shown numbered 201, and has a voltage 'Vin'. An example value of Vin in an embodiment of VRM 110 is about 21 volts (V). Also shown is a supply voltage Vcc (202), which may be provided by phase controller 210, and which may be used for powering the blocks within each power stage.

Although the features of the present disclosure are described in the context of a multi-phase switching converter, it must be understood that the features can be implemented in a single-phase switching converter as also noted above.

VRM 110 is shown containing phase controller 210, smart power stages (SPS) (or 'power stages') SPSA-1 (220-1) through SPSA-3 (220-3), SPSB-1 (230-1) through SPSB-4 (230-4), inductors 225A-1 through 225A-3 and 227B-1 through 227B-4 and capacitors 226A-1 through 226A-3 and 228B-1 through 228B-4. Power supply Va (240) (Rail-A) is generated by a 3-phase buck converter (there are three SPSes-220-1 through 220-3), while power supply Vb (250) (Rail-B) is generated by a 4-phase buck converter (there are four SPSes-230-1 through 230-4). Nodes/Paths 240 and 250 can correspond to paths 112A and 112B of FIG. 1. In the interest of conciseness, other power supply circuits that generate supplies on paths 113, 114 and 115 are not shown in FIG. 2. In alternative embodiments, VRM 110 can have more or fewer power rails as well as power stages per rail.

In an embodiment of the present disclosure, each of the power stages as well as the phase controller is implemented as separate integrated circuits (ICs). However, in other embodiments, the implementations of the power stages and phase controller may be different.

Phase controller 210 in conjunction with one or more power stages of a rail operates to generate a regulated voltage as output. In the example of FIG. 2, phase controller 210 in combination with one or more of power stages SPSA-1 through SPSA-3 operates to generate regulated voltage Va (240). Similarly, phase controller 210 in combination with one or more of power stages SPSB-1 through SPSB-4 operates to generate regulated voltage Vb (250). Accordingly, Va (240) and Vb (250) are shown as being provided as inputs to phase controller 210 to enable operation of one or more feedback loops within phase controller 210 to regulate voltages Va and Vb. Phase controller 210 also receives inductor-current information (regarding current flowing through each of the inductors) from each of the SPSes to enable various operations such as current-mode control of voltage regulation, current limiting, short circuit protection, and balancing the currents generated by each SPS of a same converter (or 'rail') so as to make the currents from each SPS of a rail to be substantially equal in magnitude. The other signals flowing between phase controller 210 and the SPSes are described below.

The combination of (corresponding circuitry within) phase controller 210, an SPS and the corresponding inductor and capacitor forms one "phase" of a rail. Thus, for example, SPSA-1, inductor 225A-1, capacitor 226A-1, and the corresponding portion within phase controller 210 form a single buck converter, and one phase of the 3-phase buck converter. It is noted here that, while each phase is shown as having its own separate capacitor (e.g., 226A-1), in another embodiment, only a single larger capacitor (larger capacitance) may be employed at node 240 (as well as 250). In other embodiments, multiple capacitors are placed close to the load powered by the corresponding supply voltage. For simplicity, an individual SPS is also referred to as a phase of a power-rail.

Each SPS (or in general a 'power stage') may be implemented to contain a high-side switch, a low-side switch, gate-drive circuitry for the two switches, a temperature monitor circuit and an inductor-current-sense circuit/block to provide information indicating the magnitude of inductor-current to phase controller 210. The current supplied by an SPS, and therefore the corresponding inductor-current generally depends on the load current drawn from the supply voltage, although the high-side switch and low-side switch of an SPS may be viewed as 'driving' the inductor. Each SPS receives a source of power (which can all be the same source) as an input which is connected to the high-side switch (shown in detail in sections below).

Each SPS communicates with phase controller 210 via corresponding signals PWM, SYNC, CS and TMP. Thus, SPSA-1 is shown connected to phase controller 210 through signal/paths PWMA-1 (211), SYNC-A (212), CSA-1 (213) and TEMPA (214). SPSA-6 communicates with phase controller 210 via signals PWMA-6, SYNC-A, CSA-6 and TEMPA (214), although in FIG. 2, the respective connections of signals PWMA-6, SYNC-A and CSA-6 to phase controller 210 are not shown. Similarly, SPSB-1 is shown connected to phase controller 210 through signal/paths PWMB-1 (216), SYNC-B (217), CSB-1 (218) and TEMPB (219). SPSB-3 communicates with phase controller 210 via signals PWMB-3, SYNC-B, CSB-3 and TEMPB (219), although in FIG. 2, the respective connections of signals PWMB-3, SYNC-A and CSB-3 to phase controller 210 are not shown. The other SPSes would have similar connections with phase controller 210. In general, each SPS has a PWM, SYNC, CS and TEMP pin for the corresponding connections noted above when implemented as an IC, and the corresponding signals to/from a power stage from/to phase controller 210 may be generally referred to as the PWM, SYNC, CS and TEMP signal corresponding to that power stage.

Signal PWM is an input to an SPS from phase controller 210 and represents a pulse-width modulated (PWM) signal. A PWM signal may be generated to have a logic HIGH state, a logic LOW state or a high-impedance (Hi-Z) state. Typically, the logic HIGH and logic LOW states of the PWM signal correspond respectively to the voltages (within error/noise margins) of the positive and negative rails of the power supply of the circuit generating the PWM signal, and the Hi-Z state corresponds to the mid-rail voltage of the power supply (or a voltage-window around the mid-rail voltage), as is well known in the relevant arts. However, other conventions can be employed for the three states of the PWM signal as would be apparent to one skilled in the relevant arts.

The PWM signal controls the opening and closing of high-side switch and low-side switch of a phase/power stage via the logic HIGH and logic LOW states. Typically, the logic HIGH state is used to switch ON (i.e., close) the high-side switch and switch OFF (i.e., open) the low-side switch (the corresponding duration may be referred as the 'first interval'), while the logic LOW state is used to switch ON the low-side switch and switch OFF the high-side switch (the corresponding duration may be referred as the 'second interval'). Each cycle of the PWM signal has corresponding a 'first interval' and a 'second interval'.

The Hi-Z state of the PWM signal indicates to the power stage that the power stage is not to operate in generating the output voltage, i.e., be 'inactive'. Thus, when PWM is in the Hi-Z state, both the high-side and low-side switches of the stage are OFF, and the power stage can go to low-power/power-down modes. In general, phase controller 210 is designed to generate the PWM signal in a manner capable of indicating three states, with one of the three states indicating that the corresponding power stage is to be inactive. It will be apparent to one skilled in the relevant arts that such tri-state capability can be implemented in other ways. As an example, phase controller 210 can be implemented to generate PWM as a conventional binary signal with the power stages implemented to identify a Hi-Z state if the PWM signal is turned OFF, i.e., not generated at all.

The duty cycle of the PWM signal is set by phase controller 210 and is designed to generate the desired power supply voltage and/or control/change the current supplied by that phase. For example, PWMB-1 would have a duty cycle as required for the magnitude of Vb and the current to be provided by SPSB-1. The magnitude of current flowing through the inductor corresponding to a power stage is determined by ON durations of the high-side switch and the low-side switch of that stage, and is set by the stage's PWM input (or control signal in general).

As is well known in the relevant arts, the PWM signals to each SPS of a same converter may be staggered, i.e., delayed with respect to each other in phase such that typically no two high-side switches of a rail (i.e., in respective SPSes) are ON at the same time. Such a technique is employed for reasons such as, for example, to ensure that the peak instantaneous current drawn from Vin is relatively low at all times.

Signal SYNC is a common (single) input (e.g., SYNC-B (217)) to all the SPSes of a power rail, and may be used by phase controller 210 for the purposes of waking-up the corresponding SPSes upon power-up of the power supply 110, and also to indicate the power-mode (e.g., PS2, PS3), i.e., output current requirement, of the multi-phase converter. Signal SYNC is set to the High-impedance (Hi-Z) state to signal that the SPSes are to be shut down, i.e., all SPSes are to become inactive, and the corresponding power supply is not generated. In an embodiment, the Hi-Z state is a voltage level/band between the logic HIGH and logic LOW voltage levels of the SYNC signal Signal CS (current-sense) is an input to phase controller 210 from an SPS/phase, and contains information regarding the magnitude of the inductor-current of that phase. The information can be in the form of a current, voltage, digital values, etc., depending on the specific implementation of the power stages and phase controller 210. A CS block in an SPS implements the current-sense operation and sends signal CS to phase controller 210.

In an embodiment of the present disclosure, the current-sense block of a power stage sends the sensed inductor-current information to phase controller 210 in the form of a current that can be of either the same magnitude as the inductor-current or (more typically) be a scaled-down version (in terms of magnitude) of the inductor-current. Correspondingly, in the embodiment, phase controller 210 is designed to receive the information in the form of a current, with the scaling factor being known to phase controller 210 as well as the (corresponding) power stage when scaling is used.

The TEMP pins (or nodes) of all the stages of a rail are wired together, and only a single TEMP input is provided to phase controller 210, as may be observed from FIG. 2. For example, corresponding to rail-B, a single connection TEMPB (219) is provided to phase controller 210 based on the temperatures reported by each power stage of rail-B. Such an approach is usually adopted to minimize the number of wires/PCB (printed circuit board) tracks (and therefore signals) from the power stages of a rail to phase controller 210, as well as to reduce the pinout (number of pins) of phase controller 210. The temperature of a power stage is proportional (has a positive correlation with) the magnitude of the inductor-current of the power stage.

As noted above, there is often a need to have power stages capable of providing higher magnitude currents. As an example, there may be a requirement to double the power available from Rail-B (e.g., by doubling the total current sourcing capability with the voltage Vb remaining the same as before). Such a requirement can be met by doubling the number of power stages/phases of Rail-B to eight. However, doubling the number of power stages to eight may require substantial increase in the size of the board (printed circuit board/PCB) on which the components/blocks of VRM 110 are assembled, and more importantly may require re-design/modification of phase controller 210 to be able to support the larger number of power stages. For example, phase controller 210 may need to have more pins and corresponding circuitry.

Power capability of a rail can be increased (e.g., doubled) by employing a current-doubling power stage configuration. In such a configuration, two power stages are configured/connected in a 'parallel' fashion. Both of the power stages in such current-doubling configuration receive and use the same PWM/control signal from the phase controller and also provide a combined (single) current information to the controller.

However, one problem with such a configuration is imbalance (un-equalness) between the individual currents provided by each power stage of the current-doubling configuration. Such imbalance may result since the phase controller receives only a single (combined) current information from the current-doubling configuration and has only one PWM signal for controlling each power stage of the configuration.

As described next, several aspects of the present disclosure achieve higher current (e.g., current-doubling) while also achieving current balancing. Furthermore, current balancing is achieved without having to increase the number of pins in one or both of the power stages of the current-doubling configuration.

4. Power Stage

Figure 3A:
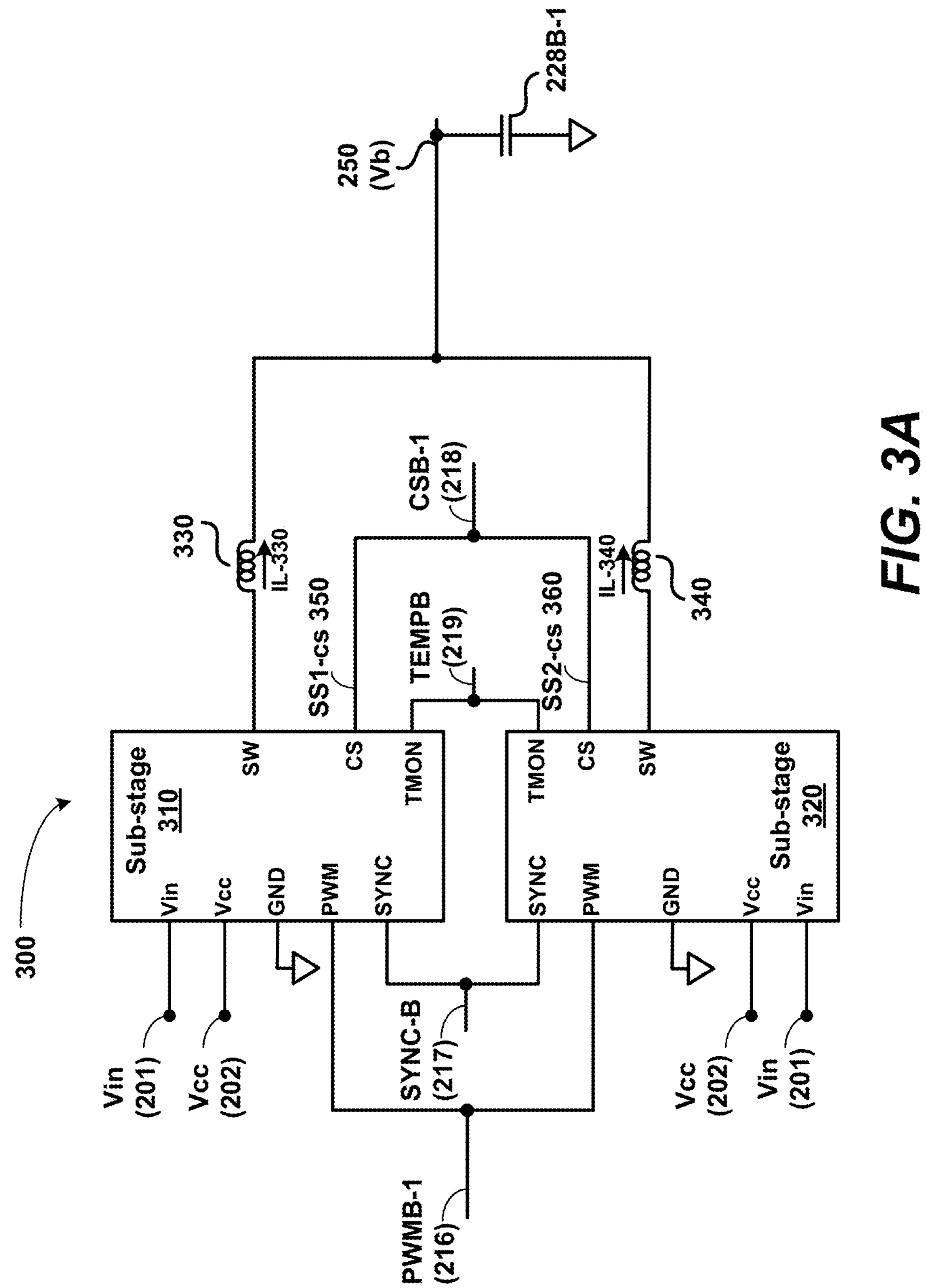
FIG. 3A is a block diagram of a power stage configured to provide higher current, in an embodiment of the present disclosure.

FIG. 3A is a block diagram of a power stage configured to provide higher current, in an embodiment of the present disclosure. Power stage 300 is shown containing two sub-stages 310 and 320. Power stage 300 can be used in place of any of the power stages of FIG. 2 if higher current/power capability is needed. For example, by replacing each of stages SPSB-1 through SPSB-4 (FIG. 2) by corresponding instances of power stage 300, the power available from Rail-B (of FIG. 2) can be doubled. Alternatively, only some of the stages SPSB-1 through SPSB-4 can be replaced by corresponding instances of power stage 300 if less than double the power is sufficient. As will be clear from the description below, the interface between power stage 300 and phase controller 210 (FIG. 2) is the same as that between a power stage shown in FIG. 2 and phase controller 210.

Each of the sub-stages 310 and 320 receives Vin (201), Vcc (202), PWMB-1 (216) and SYNC-B (217) (all shown in FIG. 2) as inputs. 'GND' represents a ground pin.

The 'TMON' pins/nodes of each of the sub-stages provides temperature information. The TMON outputs are connected to each other and to phase controller 210 via path TEMPB (219).

The 'SW' (switching) pins/nodes of the sub-stages 310 and 320 are respectively connected to one end of respective inductors 330 and 340. Each SW node is the junction of the corresponding high-side and low-side power switches in a sub-stage. The other end of inductors 330 and 340 are connected to node 250 (Vb) on which the regulated voltage of Rail-B is provided.

The 'CS' pins/nodes of each of sub-stages provides inductor-current information. In general, the inductor-current information can be in any suitable form such as current, voltage or digital values. In an embodiment of the present disclosure, the inductor-current information provided is in the form of a corresponding current (also referred to as 'sensed-current' herein).

Thus, the CS pin of sub-stage 310 provides current SS1-*cs* (350) representing the magnitude of current flowing through inductor 330, while the CS pin of sub-stage 320 provides current SS2-*cs* (360) representing the magnitude of current flowing through inductor 340. The two CS pins are connected to each other, and to phase controller 210 via path CSB-1 (218).

Since each of sub-stages 310 and 320 receive the same control signal PWMB-1, the respective output currents (inductor-current through inductor 330 and 340 respectively) of the two sub-stages are nominally the same, and the total current delivered by the two sub-stages to supply node Vb is therefore twice as that provided by SPSB-1 of FIG. 2. Thus, power stage 300 is a current-doubling stage.

However, as noted above, several factors may cause the currents through inductors 330 and 340 to be substantially different. Some of the reasons for such current imbalance can be timing differences related to processing of the PWM input in the sub-stages and part-to-part variations.

According to aspects of the present disclosure, sub-stages 310 and 320 are designed to balance/equalize or at least minimize the difference in the current magnitudes of respective inductor-currents through inductors 330 and 340. Further, such current-balancing is achieved without the requirement of additional pins or additional output nodes on sub-stages 310 and 320, for example, for communicating respective inductor-current magnitudes to each other. The term 'equalize' or 'balancing' as used herein is intended to include exact equality of the currents as well as a small degree of inequality (such as a maximum inequality of 5% of the higher of the two currents). In an embodiment, the sub-stages operate to minimize the difference in the average values of the two currents over a corresponding interval, such as for example, a pair of successive pair PWM cycles.

Figure 3B:
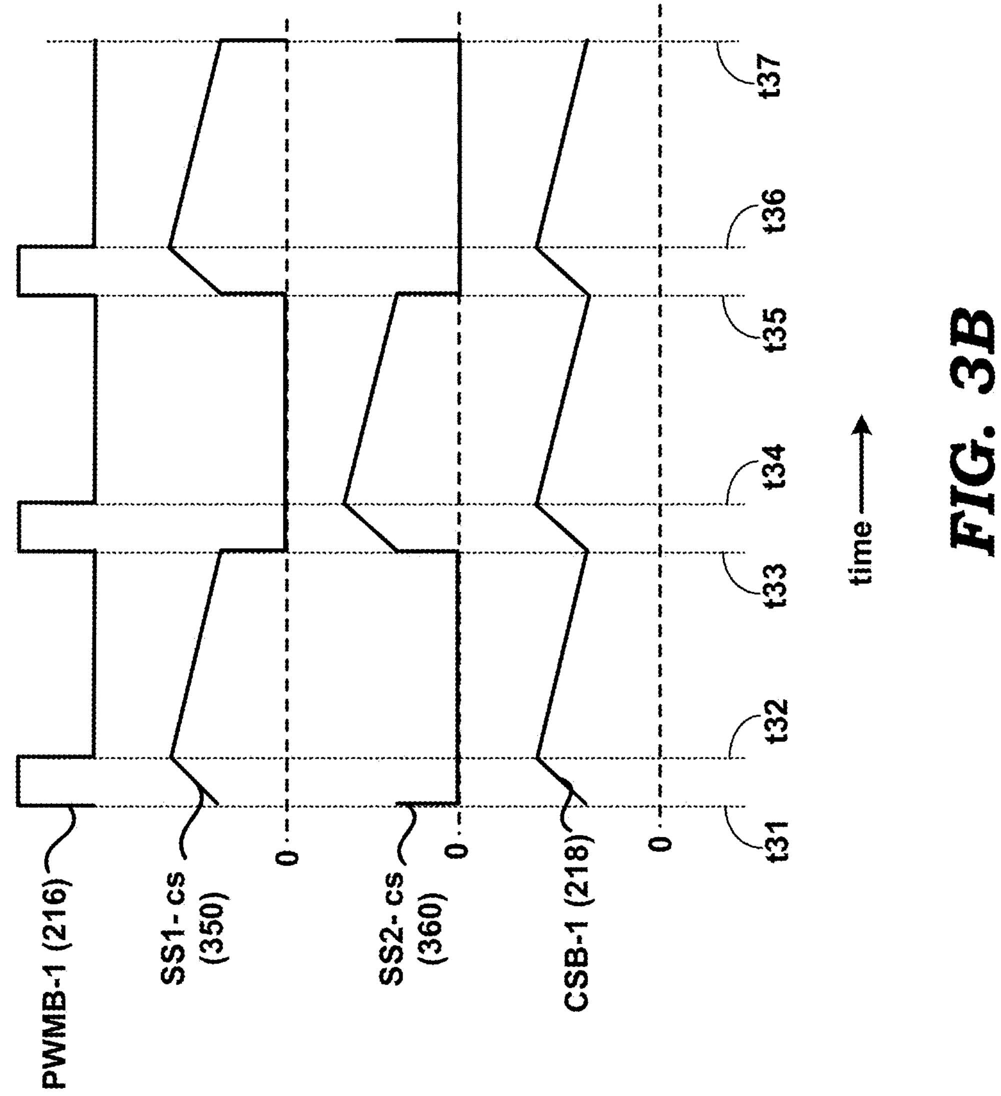
FIG. 3B is a timing diagram illustrating the manner in which sensed-currents are transmitted by the two sub-stages of a power stage, in an embodiment of the present disclosure.

According to an aspect of the present disclosure, current-balancing is achieved without the need for additional pins on subs-stages 310 and 320 by designing and operating sub-stages 310 and 320 to provide the respective sensed-current (magnitude) multiplied by two on path CSB-1 (218) in alternate cycles of control signal PWMB-1 (216). FIG. 3B illustrates such a feature. Example waveforms of PWMB-1, sensed-current (SS1-*cs* 350) output by sub-stage 310, sensed-current (SS2-*cs* 360) output by sub-stage 320 and the signal on path CSB-1 (218).

Three cycles of PWMB-1 are shown in FIG. 3B. It is assumed in the example that sub-stage 310 and sub-stage 320 are to transmit their respective sensed-currents to phase controller 210 in odd and even cycles respectively of PWMB-1. PWMB-1 is a logic HIGH in interval t31-*t*32 of the first cycle and logic LOW in interval t32-*t*33 of the first cycle. PWMB-1 is a logic HIGH in intervals t33-*t*34 and t35-*t*36, and a logic LOW in intervals t34-*t*35 and t36-*t*37 of the subsequent two cycles. Sub-stage 310 is shown providing double its sensed-current SS1-*cs* in the first and third cycles of PWMB-1 in the Figure, while sub-stage 320 is shown providing double its sensed-current SS2-*cs* in the second cycle of PWMB-1. It may be observed from FIG. 5 that the sub-stages provide the respective information in alternate cycles. Accordingly, waveform SS1-*cs* is shown as indicating a zero in interval t33-*t*35, while waveform SS2-*cs* is shown as indicating a zero in intervals t31-*t*33 and t35-*t*37. The current on path CSB-1 is the sum of the currents SS1-*cs* and SS2-*cs*.

As noted above, the sensed-current provided by each sub-stage represents twice its actual inductor-current. Thus, for example, the waveform of SS1-*cs* in interval t31-*t*33 represents (2*inductor-current through inductor 330) in that interval, and the waveform of SS2-*cs* in interval t33-*t*35 represents (2*inductor-current through inductor 340). Such a technique ensures that phase the total inductor-current provided by power stage 300 is indicated to phase controller 210. Further, the technique enables each one of the two subs-stages to obtain the inductor-current magnitude of the other sub-stage without requiring a separate pin or path for communicating such magnitude, and thereby correct the imbalance/inequality (if any) in the two inductor-currents IL-330 (current through inductor 330—'first sub-current') and IL-340 (current through inductor 340—'second sub-current"), as described next.

5. Balancing the Inductor-Currents

Figure 4:
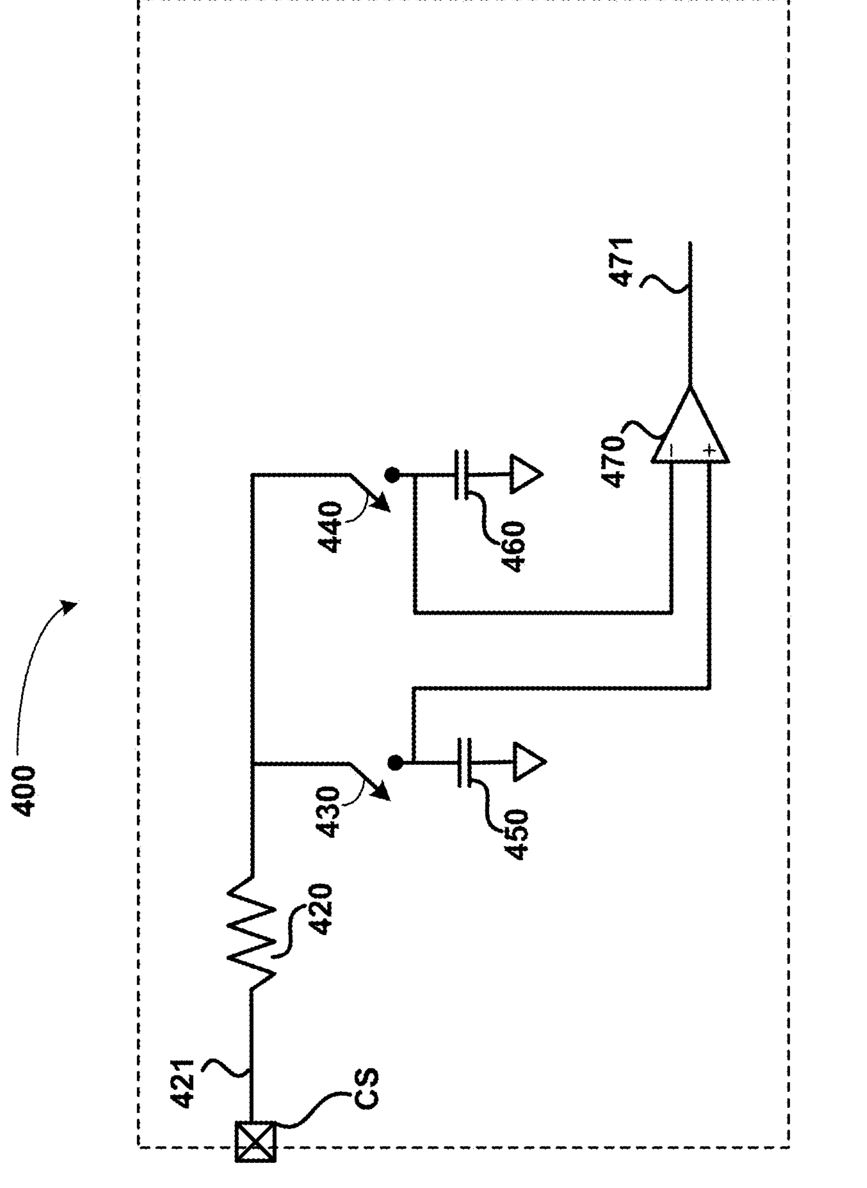
FIG. 4 is a diagram illustrating the implementation details of a 'current imbalance detector' in a sub-stage, in an embodiment of the present disclosure.

FIG. 4 is a diagram illustrating the implementation details of a 'current imbalance detector' in a sub-stage, in an embodiment of the present disclosure. Current imbalance detector 400 may be implemented within each of sub-stages 310 and 320, and is shown containing resistor 420, switches 430 and 440, capacitors 450 and 460 and comparator 470. Pin/node 'CS' in FIG. 4 corresponds to 'CS' pin/node of each of sub-stages 310 and 320 shown in FIG. 3A. Path 421 is shown connecting the CS pin/node to one end of resistor 420.

Switches 430 and 440 are closed only in alternate cycles of PWMB-1 and open otherwise. Following the 'odd' and 'even' convention noted with respect to the description of FIG. 3B, switch 430 is closed (and switch 440 is open) in odd cycles of PWMB-1 (when sub-stage 310 is sending its sensed-current on its CS pin), and switch 440 is closed (and switch 430 is open) in even cycles of PWMB-1 (when sub-stage 320 is sending its sensed-current on its CS pin). Referring to FIG. 3B, switch 430 in current imbalance detector 400 of both of sub-stages 310 and 320 would be closed in intervals t31-*t*33 and t35-*t*37 (with switch 440 of both sub-stages being open), and switch 440 in current imbalance detector 400 of both of sub-stages 310 and 320 would be closed in interval t33-*t*35 (with switch 430 of both sub-stages being open). As a result, the respective sensed-currents provided by the sub-stages are filtered by respective RC filters (resistor 420 plus capacitor 450, and resistor 420 plus capacitor 460) and stored respectively as corresponding voltages in capacitors 450 and 460. The voltages across each capacitor represents an average of the corresponding currents over a corresponding interval. Which sub-stage is to transmit its sensed-current to phase control 210 in odd cycles and which sub-stage in even cycles is determined as described with example techniques below.

Comparator 470 (or 'comparison circuit' in general) compares the respective voltages across capacitors 450 and 460, and generates a comparison result on its output 471, which is a binary signal in an embodiment. Based on the result of the comparison, one or both sub-stages internally modifies the corresponding (internal) copy of PWMB-1. For example, if the voltage across capacitor 450 is greater than that across capacitor 460, that would mean that sub-stage 310 is supplying more current than sub-stage 320, and signal 471 would be a logic HIGH in both sub-stages.

Consequently, sub-stage 310 would reduce the pulse-width (logic HIGH duration) of its internal copy of PWMB-1, thereby causing its inductor-current IL-330 to reduce. Additionally, or optionally, sub-stage 330 would increase the pulse-width (logic HIGH duration) of its internal copy of PWMB-1, thereby causing its inductor-current IL-340 to increase. The extent by which the corresponding internal copy of PWMB-1 is increased or decreased may be pre-determined and implemented within the circuit/block used in the sub-stages for such purpose, as illustrated in sections below with an example. Further, the increase and/or decrease may be performed at the end of every two cycles of PWMB-1 or some other even multiple of one cycle of PWMB-1. Alternatively, such increase and/or decrease can be performed at other rates, as would be apparent to a skilled person upon reading the disclosure herein. Generally, the range from maximum increase to maximum decrease is limited to the expected current mismatch.

The 'current balancing loop' formed by block 400 and the PWMB-1 'pulse-adjuster' operates to balance/equalize the two inductor currents IL-330 and IL-340. When balance is reached, the loop will stop further adjustments or corrections to PWMB-1 (or alternate between the smallest increase and smallest decrease of the pulse width). Alternatively, comparator 470 can be implemented to have a dead-zone having a pre-determined voltage range about 0V, such that signal 471 is at either of the two logic levels only if the voltage difference between the voltages across capacitors 450 and 460 exceeds the range, signal 471 being tri-stated (high-impedance) otherwise.

The implementation details of a sub-stage in an embodiment of the present disclosure are illustrated next.

6. Sub-Stage

Figure 5:
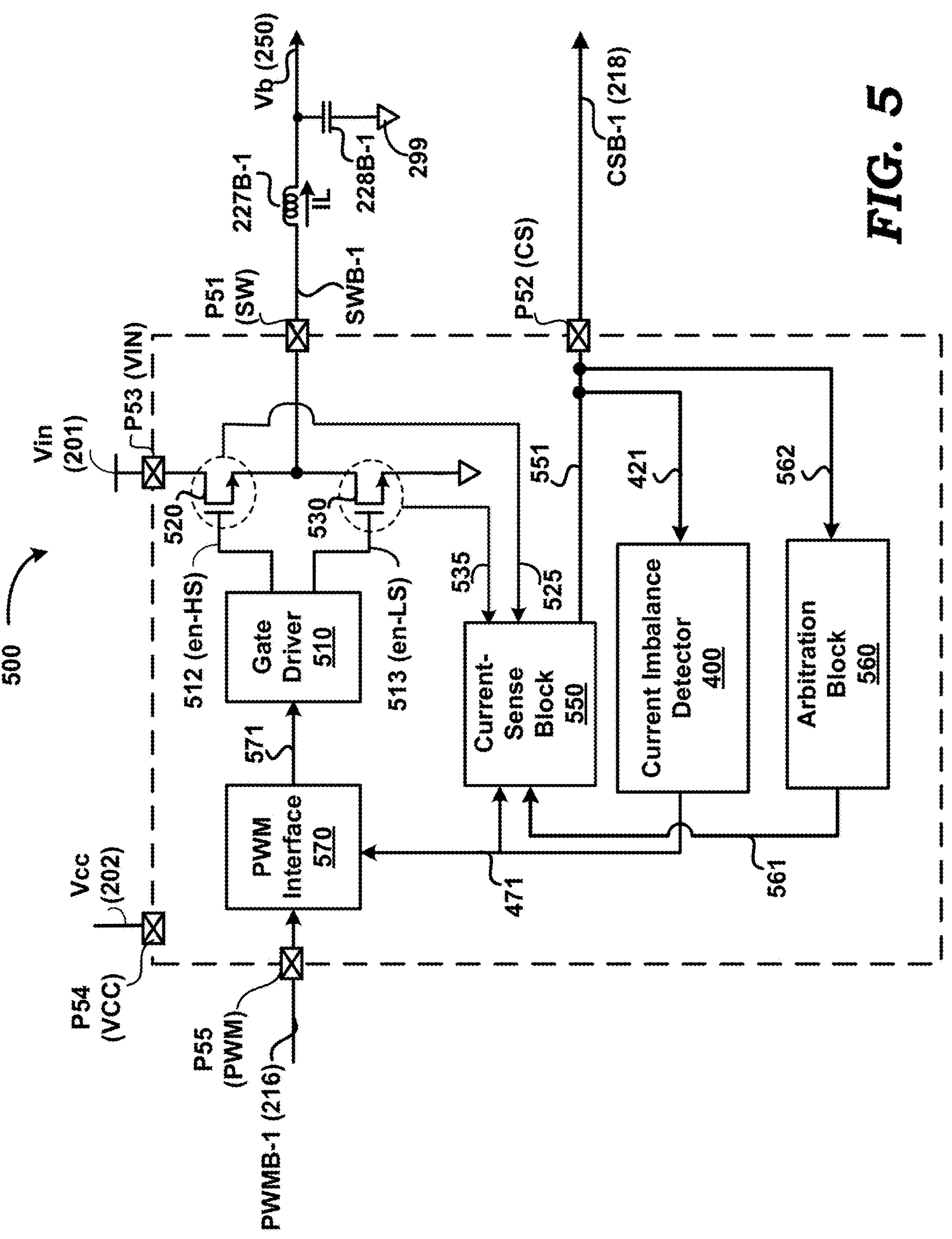
FIG. 5 is a bock diagram of a sub-stage of a power stage, in an embodiment of the present disclosure.

FIG. 5 is a block diagram illustrating the implementation details of a sub-stage in an embodiment of the present disclosure. Each of sub-stages 310 and 320 of FIG. 3A can be implemented as sub-stage 500 shown there. Sub-stage 500 is shown containing gate driver 510, high-side (HS) switch 520, low-side (LS) switch 530, current-sense block 550, current imbalance detector 400, arbitration block 560 and PWM interface 570. Also shown in FIG. 5 are inductor 580 (which corresponds to either inductors 330 or inductor 340 of FIG. 3A) and capacitor 228B-1 (FIG. 2). P51 through P55 represent pins SW, CS, Vin, Vcc and PWM (of either of sub-stages 310 and 320 shown in FIG. 3A) when sub-stage 500 is implemented as an integrated circuit (IC). In alternative implementations (e.g., in discrete form), P31 through P35 represent corresponding circuit nodes. Vcc (202) is used to power the internal blocks of sub-stage 500. The drain terminal of HS switch 520 is connected to Vin (201), and the source terminal of LS switch 530 is connected to ground. Although not shown in FIG. 5 in the interest of conciseness, sub-stage 500 may contain various other blocks/circuits such as level-converters for gate driver 510, temperature sensors, etc.

Current imbalance detector 400 is implemented as shown in FIG. 4 and described above. Path 421 is a connection from CS pin P52 to block 400, specifically to resistor 420 (FIG. 4).

PWM interface 570 receives PWM signal PWMB-1 (216) (from phase controller 210) and pulse-width-adjust signal 471 from current imbalance detector 400. An internal inverter generates the inverse of signal 471. Signal 471 may be viewed as an 'increase-pulse-width' or UP signal (575), while the inverse may be viewed as a 'decrease-pulse-width' or DN signal (576). Based on the logic level (UP/increase or DN/decrease) of signal 471, PWM interface 570 increases or decreases the pulse-width (logic HIGH duration) of PWMB-1, and forwards the adjusted PWMB-1 to gate driver 510. When PWMB-1 is in the Hi-Z (high-impedance) state (a state when the voltage of PWMB-1 is approximately mid-way between the voltage levels representing a logic HIGH and a logic LOW), PWM interface 570 forwards PWMB-1 without any adjustment/change. PWM interface 570 may be viewed as a 'modulator' for modulating the pulse width of PWMB-1 depending on signal 471. An example implementation of PWM interface 570 in an embodiment is described below with respect to FIG. 8.

Gate driver 510 receives the adjusted PWMB-1, and in response to the logic level of the adjusted PWMB-1 generates the appropriate voltages to turn ON and turn OFF HS switch 520 and LS switch 530 in corresponding intervals. Thus, gate driver 510 turns ON HS switch 520 and turns OFF LS switch 530 for the duration of the logic HIGH level of the adjusted PWMB-1. Gate driver 510 turns OFF HS switch 520 and turns ON LS switch 530 for the duration of the logic LOW level of the adjusted PWMB-1.

HS switch 520 and LS switch 530 are each shown implemented as an N-channel MOSFET (Metal Oxide Semiconductor Field Effect Transistor) with gate driver 510 driving the gate terminals of the MOSFETs. Other implementations for the switches are also possible. In the example of FIG. 5, when the adjusted PWMB-1 is a logic HIGH, gate driver 510 generates respective appropriate voltages on paths 512 (en-HS) and 513 (en-LS) to switch-ON MOSFET 520 and switch-OFF MOSFET 530. When the adjusted PWMB-1 is a logic LOW, gate driver 510 generates respective appropriate voltages on paths 512 and 513 to switch-OFF MOSFET 520 and switch-ON MOSFET 530. When PWMB-1 is a Hi-Z (High-impedance or mid-rail) state, gate driver 310 generates the respective appropriate voltages on paths 512 and 513 to switch-OFF both of MOSFET 520 and 530. Gate driver 510 can be implemented in a known way.

Current-sense block 550 operates to determine the magnitude (for example, instantaneous magnitude) of the inductor-current through inductor 580, and provides a sensed-current indicating the inductor-current magnitude on node 551, which is connected to pin P52 (CS). Pin P52 is connected to phase controller 210 by path CSB-1 (218). Current-sense block 550 may determine the magnitude of the inductor-current by one of several known ways. For example, in FIG. 5 current-sense block 550 is shown as receiving inputs 525 and 535 respectively from HS switch 520 and LS switch 530. In an embodiment, signals 525 and 535 represent the respective voltage-drops across the HS and LS switches when the corresponding switch is ON and current is flowing through it and inductor 227B-1. Current-sense block 350 obtains the instantaneous magnitude of the inductor-current (or a scaled-down version of it) based on the voltage-drops. In an embodiment, current-sense block 550 provides/reports the inductor-current magnitude in the form of a (replica) current (sensed-current) having a magnitude that is scaled-down with respect to the instantaneous inductor-current magnitude. However, in alternative embodiments, current-sense block 550 can be implemented to provide the information in the form of a voltage or a digital value(s).

As noted above, the two sub-stages of power stage 300 should transmit the respective sensed-currents only in alternate cycles of the PWM signal. Therefore, the current sense block 550 of one of the sub-stages must be designated to transmit its sensed-current only in odd cycles while the current sense block 550 of the other sub-stage must be designated to transmit its sensed-current only in even cycles. Current-sense block 550 is implemented to contain an internal switch (or other suitable 'disable circuit') to electrically connect its output node (on which its sensed-current is provided) to path 551, and therefore pin P52, in only one of either odd cycles of PWMB-1 or even cycles of PWMB-1 depending on the designation noted above. Such capability also allows current imbalance detector 400 to receive the sensed-current transmitted by the current-sense block of the other sub-stage of the pair during the corresponding cycles, and thereby to enable the comparison and current-balancing as noted herein.

In an embodiment of the present disclosure, upon power-up/RESET, both sub-stages are allowed to commence normal operations to generate voltage Vb, (i.e., power switches HS switch and LS switch start switching based on PWMB-1, respective sensed-currents are provided on the respective CS pins, etc.), and only if both sub-stages are found to be transmitting respective sensed-currents in the same cycle(s) of PWMB-1, then one sub-stage is forced to 're-synchronize', i.e., shift transmitting its sensed-current by one cycle of PWMB-1, and thereafter transmit its sensed-current in every other cycle of PWMB-1, with the other sub-stage continues transmitting its sensed-current as before without any change. Such forcing is achieved by assigning a logic 1 to one sub-stage and a logic 0 to the other sub-stage, with the convention that the sub-stage that is assigned the logic 1 will perform the shifting of transmission and resumption noted above.

In an embodiment, the current-sense block of each sub-stage contains a detection circuit (not shown) for the detection of simultaneous transmission of the respective sensed-currents in same PWM cycles. The detection circuit compares the difference between the voltages across capacitors 450 and 460 (FIG. 4) and compares the difference with a threshold voltage. When both sub-stages transmit their respective sensed-currents simultaneously in the same cycles, the difference between the voltages across capacitors 450 and 460 will be large (typically, much larger than the difference when the sub-stages transmit the sensed-currents in alternate cycles only). If the difference is greater than the threshold voltage, the detection circuit asserts a logic signal to indicate simultaneous transmission (i.e., in the same cycles). The status of the logic signal is used to cause the sub-stage that was assigned a logic 1 to shift its transmission of sensed-current by a one cycle. The detection circuit can be implemented in a known way, and the threshold voltage can be preset based, for example, on the specifications and/or operating parameters of the sub-stages. The circuit of FIG. 7 (described below) illustrates an example circuit to cause such shift of transmission (which may be viewed as a 're-synchronization'), and is described next.

Figures 6, 7:
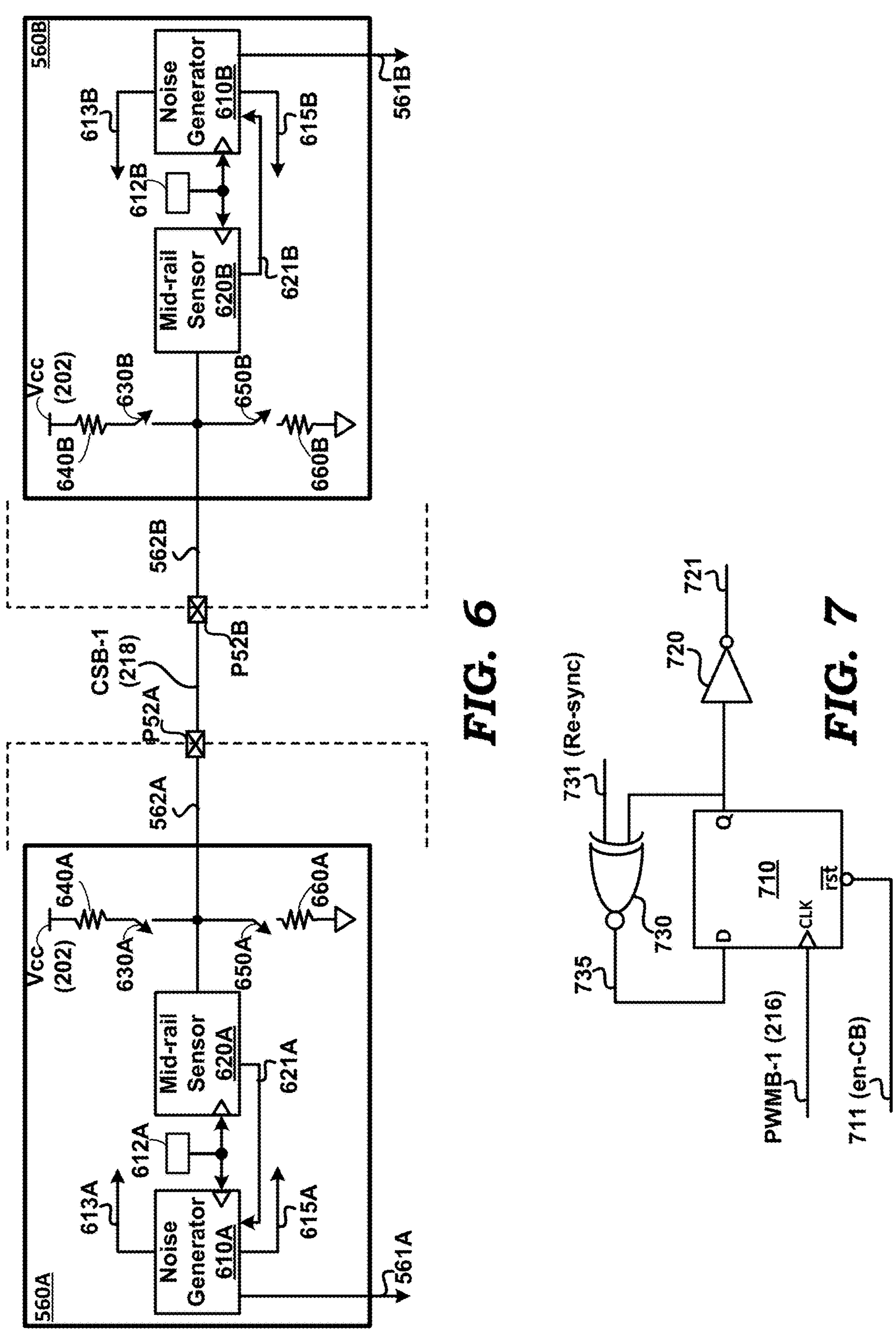
FIG. 6 is a diagram illustrating the implementation details of an arbitration block, in an embodiment of the present disclosure.
FIG. 7 is a diagram illustrating the details of a re-synchronization circuit in a current-sense block of a sub-stage, in an embodiment of the present disclosure.

FIG. 7 is a diagram illustrating the details of a 're-synchronization circuit' in current-sense block 570 in an embodiment of the present disclosure. The circuit contains a flip-flop 710, inverter 720 and XNOR gate 730. The output 735 of XNOR gate 730 is connected to the data input (D) of the flip-flop. The output (Q) of flip-flop 710 is connected as inputs to XNOR gate 730 and inverter 720. Output 721 of inverter 720 is used to close or open the switch (noted above) between the internal node of current-sense block 550 that provides the sensed-current and path 551 depending on its logic level. Signal 731 (Re-sync) is a logical AND of the output of the detection circuit and the logic level assigned to a sub-stage by its arbitration block. Thus, if detection circuit detects simultaneous transmission of the respective sensed-currents from both sub-stages in a same PWM cycle AND the logic level assigned to a sub-stage is logic HIGH/ONE, then signal 731 is a logic high. Re-sync 731 is a logic low otherwise. Flip-flop 710 receives PWMB-1 on its clock terminal CLK, and an enable signal 711 (en-CB) for enabling/disabling current-balancing on its reset input (rst\).

The operation of the circuit of FIG. 7 in the sub-stage that was assigned a logic 1 is now described. With current-balancing enabled and signal Re-sync 731 at logic 0 (indicating no 'simultaneous transmission' of sensed-current by both sub-stages in the same PWM cycle), output Q (and therefore signal 721) toggles at every rising-edge of PWMB-1. As a result, the sensed-current output of sub-stage 500 is provided on path 551 in every other cycle (e.g., odd cycles, with the other sub-stage sending its sensed-current in even cycles). However, if Re-sync 731 is a logic 1, then output Q retains its current logic level (i.e., logic level in the current PWM cycle) for the next PWM cycle also. Therefore, signal 721 also retains its current value in the next PWM cycle. As a result, the transmission of the sensed-currents from the two sub-stages is forced to be in alternate cycles of PWMB-1 from the next PWM cycle onwards, which would also cause the detection circuit to de-assert Re-sync to logic zero in the next PWM cycle. The sub-stage assigned a logic 0 does not alter its sensed-current transmission duration since its Re-Sync signal 721 would be a logic 0, and therefore continues to transmit its sensed-current in every other PWM cycle.

In an alternative embodiment of the present disclosure, the assigning of the logic 1 and logic 0 to the sub-stages noted above is performed upon power-up/RESET and prior to commencement of normal operations as noted above, including transmission of sensed-current. Upon commencement of normal operations, the sub-stage that was assigned a logic 1 transmits its sensed-current only in odd cycles of PWMB-1, while the sub-stage that was assigned a logic 0 transmits its sensed-current only in even cycles of PWMB-1. Current-sense block 550 can be designed in a known way to support such a feature in the alternative embodiment. In such an embodiment, there is no need of the re-synchronization noted above.

The assignment of a logic 1 to one sub-stage and a logic 0 to the other sub-stage can be achieved in one of several known ways. In an embodiment of the present disclosure, such assignment is performed by arbitration block 560 which is described below with reference to FIG. 6.

In another embodiment, arbitration block 560 is not implemented. Instead, two versions (e.g., having different part numbers) of sub-stages are manufactured. One version is designed to have a non-volatile memory (NVM) that is pre-programmed to store a logic 1, and the other version is designed to have a non-volatile memory (NVM) that is pre-programmed to store a logic 0. A user then uses one sub-stage each of the two versions. In yet another embodiment of the present disclosure, instead of a pre-programmed bit in an NVM, each sub-stage is designed to have an input pin that a user can connect to a logic high voltage or a logic low voltage to assign a logic 1 or a logic 0.

The implementation details of arbitration block 560 in an embodiment of the present disclosure are described next.

7. Arbitration Block

FIG. 6 is a diagram illustrating the implementation details of an arbitration block, in an embodiment of the present disclosure. Arbitration blocks 560A and 560B are implemented identically, and are contained respectively in sub-stages 310 and 320 (FIG. 3A). Arbitration block 560A/560B is shown containing noise generator 610A/610B, mid-rail sensor 620A/620B, clock generator 612A/612B, switch 630A/630B, switch 650A/650B, resistor 640A/640B and resistor 660A/660B. Only the implementation and operation of the internal blocks of arbitration block 560A are described below. The corresponding internal blocks of arbitration block 560B are implemented and operate in a similar manner.

Clock generator 612A generates a clock signal (also referred to herein by numeral 612A).

Noise generator 610A represents a random noise sequence generator in the form of bits, and receives clock 612A. Noise generator 610A generates, at every clock cycle (e.g., rising edge) of clock 612A, a corresponding bit of the random sequence and the logical inverse of that bit on respective paths 613A and 615A, each of which causes switches 630A and 650A to close or open. Noise generator 610A is implemented such that there is a non-zero probability of the output bits of 610A and 610B at a clock edge are different. In an embodiment, noise generator 610A is an analog noise generator.

Mid-rail sensor 620A receives clock 612A. At every clock cycle (e.g., rising edge), mid-rail sensor 620A measures the voltage on pin P52A. If the measured voltage is approximately 1.7V (the mid-rail voltage, with Vcc being 3.3V), the mid-rail sensor 620A sends a command on path 621A to noise generator 610 to stop further operation, and send the current bit (on 615A) on path 561A.

Resistors 640A and 660A have approximately equal resistance values. Switches 630A and 650A are controllable to be open or closed based on the logic level of the bits on paths 613A and 615A respectively.

Pin P52A is connected to the junction of switches 630A and 650A by path 562A.

The frequencies of the clocks of the two arbitration blocks may be the same and the phases of the clocks may be synchronized in a known way.

In an embodiment of the present disclosure, arbitration blocks 560A and 560B together operate as described below upon power-up of VRM 110 (and the sub-stages) and prior to switching operations of the corresponding power switches (520 and 530) in each sub-stage (and therefore transmission of sensed-currents on path CSB-1) to assign the respective logic levels to the two sub-stages. Once the logic levels are assigned, both the arbitration blocks may be powered-down and all of switches 630A, 630B, 650A and 650B opened. Alternatively, pin P52A and pin P52B are respectively disconnected from paths 562A and 562B, for example using switches (not shown).

Each arbitration block 560A and 560B either pulls-up (to Vcc) or pulls-down (to ground) the path CSB-1 based on the outputs (i.e., bits on paths 613A/615A and 613B/615B) of the respective noise generators. If both of the blocks 560A and 560B pull-up CSB-1, the respective mid-rail sensors will detect a voltage approximately equal to Vcc. If both of the blocks 560A and 560B pull-down CSB-1, the respective mid-rail sensors will detect a voltage approximately equal to 0V (ground).

However, if one block pulls-up CSB-1 when the other pulls-down CSB-1, each of the mid-rail sensors will detect a voltage that has a value approximately midway (1.7 V) between Vcc and ground. When such detection happens, the arbitration operation is stopped, with the respective mid-rail sensors sending a command to the respective noise generators to freeze operations (i.e., generation of the next noise bit). Now, one of paths 561A and 561B will have a logic 1 and the other a logic 0. The assignment of a logic 1 to one sub-stage and a logic 0 to the other sub-stage is thus achieved. The respective logic levels are preserved inside the sub-stages as long as they are powered-ON.

Figure 8:
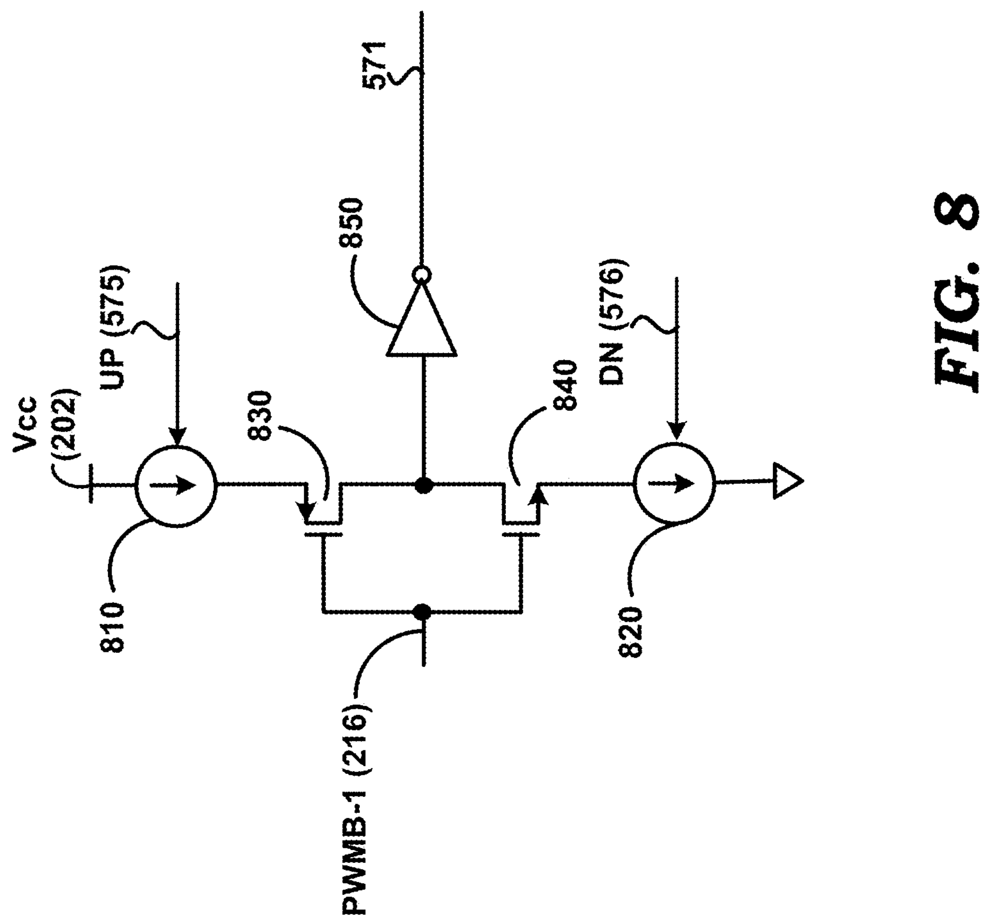
FIG. 8 is a diagram illustrating the details of a PWM interface block, in an embodiment of the present disclosure.

FIG. 8 is a diagram illustrating the details of PWM interface 570 (modulator) in an embodiment of the present disclosure. PWM interface 570 is shown containing current sources 810 and 820, P-channel MOSFET (PMOS) 830, N-channel MOSFET (NMOS) 840 and inverter 850. The currents through current sources 810 and 820 are respectively determined by signals UP (575) and DN (576), which are generated within PWM interface 570 (as noted above). When UP is a logic high (DN being a logic low), the current through 810 is increased (and therefore larger than that through 820). As a result, the falling-edge of PWMB-1 is delayed by a corresponding duration, thereby increasing the pulse-width (here logic-HIGH duration) of signal 571. On the other hand, when DN is a logic high (UP being a logic low), the current through 820 is increased (and therefore larger than that through 810). As a result, the rising-edge of PWMB-1 is delayed by a corresponding duration, thereby decreasing the pulse-width (here logic-HIGH duration) of signal 571.

8. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 2, 3A, 4, 5, 6, 7 and 8, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the NMOS transistors may be replaced with PMOS (P-channel MOS) transistors, while also interchanging the connections to power and ground terminals.

Accordingly, in the instant application, the power and ground terminals are referred to as constant reference potentials, the source (emitter) and drain (collector) terminals of transistors (though which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A switching converter comprising:

a power stage operable to drive a current through an inductance in a duration specified by a periodic control signal having a plurality of cycles constituted of odd cycles and even cycles as alternate cycles of said periodic control signal; and a phase controller to generate said control signal to cause said power stage to generate a regulated supply voltage, wherein said power stage is designed to communicate with said phase controller on a path, wherein said power stage comprises a first sub-stage and a second sub-stage, wherein each of said first sub-stage and said second sub-stage respectively drives a first sub-current and a second sub-current via corresponding inductors in response to said control signal, wherein said corresponding inductors together provide said inductance, wherein said path is used for communication between said first sub-stage and said phase controller only in said odd cycles, and between said second sub-stage and said phase controller only in said even cycles of said periodic control signal.

2. A switching converter comprising:

a power stage operable to drive a current through an inductance in a duration specified by a periodic control signal; and a phase controller to generate said control signal to cause said power stage to generate a regulated supply voltage, wherein said power stage is designed to communicate with said phase controller on a path, wherein said power stage comprises a first sub-stage and a second sub-stage, wherein each of said first sub-stage and said second sub-stage respectively drives a first sub-current and a second sub-current via corresponding inductors in response to said control signal, wherein said corresponding inductors together provide said inductance, wherein said path is used for communication between said first sub-stage and said phase controller, and then between said second sub-stage and said phase controller in alternate cycles of said control signal, wherein said path is used to communicate a magnitude of current provided by said power stage, wherein each of said first sub-stage and said second sub-stage is designed to indicate on said path twice a magnitude of each of said first sub-current and said second sub-current respectively in corresponding alternate cycles of said control signal.

3. The switching converter of claim 2, wherein said each of said first sub-stage and said second sub-stage comprises:

a current-imbalance detector to compare magnitudes of said twice a magnitude of said first sub-current and said twice a magnitude of said second sub-current indicated by said first sub-stage and said second sub-stage respectively; and a modulation circuit to receive said control signal, and to generate an adjusted control signal based on a result of said comparison, wherein said adjusted control signal has an adjusted duration to equalize the magnitudes of said first sub-current and said second sub-current, wherein respective adjusted control signals in said first sub-stage and said second sub-stage cause said first sub-stage and said second sub-stage to drive said first sub-current and said second sub-current via said corresponding inductors in response to said control signal.

4. The switching converter of claim 3, wherein each of said first sub-stage and said second sub-stage further comprises:

a high-side switch and a low-side switch to respectively drive said corresponding inductor in a first interval and a second interval periodically based on said adjusted control signal, wherein a magnitude of current flowing through said corresponding inductor is determined by ON durations of said high-side switch and said low-side switch as set by said adjusted control signal.

5. The switching converter of claim 4, wherein said each of said first sub-stage and said second sub-stage respectively comprises a first arbitration block and a second arbitration block each coupled to said path, wherein, upon power-up of said power stage and prior to switching operations of corresponding high-side switches and low-side switches in said first sub-stage and said second sub-stage, said first arbitration block and said second arbitration block together operate to assign one of a first logic level and a second logic level to said first sub-stage, and to assign the other one of said first logic level and said second logic level to said second sub-stage, wherein the sub-stage assigned the first logic level indicates said twice a magnitude of said corresponding sub-current in odd cycles of said control signal only, and wherein the sub-stage assigned the second logic level indicates said twice a magnitude of said corresponding sub-current in even cycles of said control signal only.

6. The switching converter of claim 5, wherein each of said first arbitration block and second arbitration blocks comprises:

a clock generator to generate a clock signal;

a noise generator coupled to receive said clock signal and to generate both a bit of a random binary noise sequence and an inverse of said bit at every cycle of said clock signal;

a first resistor and a first switch coupled in series between said path and a first constant reference potential, said first switch being controlled to be open or closed by said bit;

a second resistor and a second switch coupled in series between said path and a second constant reference potential, said second switch being controlled to be open or closed by said inverse of said bit; and a mid-rail sensor coupled to receive said clock signal and to said path, said mid-rail sensor to determine a voltage on said path at every cycle of said clock signal.

7. The switching converter of claim 6, wherein, upon power-up of switching convert and prior to start of switching operations of said corresponding high-side switches and low-side switches, said first arbitration block and said second arbitration block are designed at each cycle of the respective clock signals, to:

generate binary outputs and their complements of the respective random binary noise sequence by the respective noise generators;

close and open the corresponding switches based on said binary outputs and their complements;

measure, using the corresponding mid-rail sensor, a voltage on said path, wherein, if said voltage is not midway between said first constant reference potential and said second constant reference potential, then to repeat said generating, said closing and opening and said measuring, wherein if said voltage is midway between said first constant reference potential and said second constant reference potential, then to assign a respective logic level to each of the first sub-stage and said second sub-stage based on latest values of the binary outputs of said first arbitration block and said second arbitration block, and to cease further operations, wherein said respective logic levels are comprised in said first logic level and said second logic level.

8. The switching converter of claim 3, wherein said current-imbalance detector comprises:

a third resistor, a third switch, a fourth switch, a first capacitor, a second capacitor and a comparator, wherein one terminal of said third resistor is coupled to said path, the second terminal of said third resistor being coupled to a first terminal of each of said third switch and said fourth switch, wherein said first capacitor is coupled between a second terminal of said third switch and said second constant reference potential, wherein said second capacitor is coupled between a second terminal of said fourth switch and said second constant reference potential, and wherein a junction of said first capacitor and said second terminal of said third switch is coupled to a first input of said comparator, wherein a junction of said second capacitor and said second terminal of said fourth switch is coupled to a second input of said comparator, wherein an output of said comparator provides a logic signal indicating said result of said comparison.

9. The switching converter of claim 8, wherein said modulation circuit comprises:

a P-channel metal oxide semiconductor field effect transistor (PMOS), and an N-channel metal oxide semiconductor field effect transistor (NMOS), a first current source and a second current source, a first inverter and a second inverter, wherein said first inverter is coupled to receive said logic signal and to generate a logical inverse of said logic signal, wherein a magnitude of current flowing through said first current source and said second current source is determined by said logic signal and said logical inverse respectively, wherein said first current source is coupled between said first constant reference potential and a first current terminal of said PMOS, wherein said second current source is coupled between said second constant reference potential and a first current terminal of said NMOS, wherein a second current terminal of said PMOS is coupled to a second current terminal of said NMOS at a junction, said junction being coupled to an input of said second inverter, wherein a control terminal of each of said PMOS and NMOS is coupled to receive said control signal, and wherein an output of said second inverter provides said adjusted control signal.

10. The switching converter of claim 9, wherein each of said first sub-stage and said second sub-stage further comprises a detection circuit to compare a threshold voltage with a difference between respective voltages across said first capacitor and said second capacitor, if said difference is greater than said threshold voltage, said detection circuit to assert a second logic signal to indicate that both of said first sub-stage and said second sub-stage are indicating said twice a magnitude of each of said first sub-current and said second sub-current respectively in same cycles of said control signal, wherein each of said first sub-stage and said second sub-stage further comprises:

a flip-flop, a third inverter and an XNOR gate, wherein an output (Q) of said flip-flop is coupled to an input of said third inverter as well as a first one of a pair of inputs of said XNOR gate, wherein an output of said third inverter is used to enable or disable said communication on said path based on a logic level of said output, wherein a second one of said pair of inputs of said XNOR gate is coupled to receive a resynchronize signal representing a logical AND of said second logic signal and a logic level assigned to the corresponding sub-stage, wherein an output of said XNOR gate is coupled to a data (D) input of said flip-flop, wherein a clock input of said flip-flop is coupled to receive said control signal, and wherein a reset input of said flip-flop is coupled to receive an enable signal indicating whether current-balancing is enabled or not, wherein, if said resynchronization signal is a logic high, then an output of said third inverter retains its current state for an immediately next cycle of said control signal, whereby the sub-stage assigned a logic level of one is forced to shift transmitting twice the magnitude of the corresponding sub-current by one cycle of said control signal.

11. A power stage operable to drive a current through an inductance in a duration specified by a periodic control signal having a plurality of cycles constituted of odd cycles and even cycles as alternate cycles of said periodic control signal, wherein said periodic control signal is generated by an external phase controller to cause said power stage to generate a regulated supply voltage, wherein said power stage is designed to communicate with said phase controller on a path, said power stage comprising:

a first sub-stage and a second sub-stage, wherein each of said first sub-stage and said second sub-stage respectively drives a first sub-current and a second sub-current via corresponding inductors in response to said periodic control signal, wherein said corresponding inductors together provide said inductance, wherein said path is used for communication between said first sub-stage and said phase controller only in said odd cycles, and between said second sub-stage and said phase controller only in said even cycles of said periodic control signal.

12. A power stage operable to drive a current through an inductance in a duration specified by a periodic control signal, wherein said periodic control signal is generated by an external phase controller to cause said power stage to generate a regulated supply voltage, wherein said power stage is designed to communicate with said phase controller on a path, said power stage comprising:

a first sub-stage and a second sub-stage, wherein each of said first sub-stage and said second sub-stage respectively drives a first sub-current and a second sub-current via corresponding inductors in response to said periodic control signal, wherein said corresponding inductors together provide said inductance, wherein said path is used for communication between said first sub-stage and said phase controller, and then between said second sub-stage and said phase controller in alternate cycles of said periodic control signal, wherein said path is used to communicate a magnitude of current provided by said power stage, wherein each of said first sub-stage and said second sub-stage is designed to indicate on said path twice a magnitude of each of said first sub-current and said second sub-current respectively in corresponding alternate cycles of said control signal.

13. The power stage of claim 12, wherein said each of said first sub-stage and said second sub-stage comprises:

a current-imbalance detector to compare magnitudes of said twice a magnitude of said first sub-current and said twice a magnitude of said second sub-current indicated by said first sub-stage and said second sub-stage respectively; and a modulation circuit to receive said control signal, and to generate an adjusted control signal based on a result of said comparison, wherein said adjusted control signal has an adjusted duration to equalize the magnitudes of said first sub-current and said second sub-current, wherein respective adjusted control signals in said first sub-stage and said second sub-stage cause said first sub-stage and said second sub-stage to drive said first sub-current and said second sub-current via said corresponding inductors in response to said control signal.

14. The power stage of claim 13, wherein each of said first sub-stage and said second sub-stage further comprises:

a high-side switch and a low-side switch to respectively drive said corresponding inductor in a first interval and a second interval periodically based on said adjusted control signal, wherein a magnitude of current flowing through said corresponding inductor is determined by ON durations of said high-side switch and said low-side switch as set by said adjusted control signal.

15. The power stage of claim 14, wherein said each of said first sub-stage and said second sub-stage respectively comprises a first arbitration block and a second arbitration block each coupled to said path, wherein, upon power-up of said power stage and prior to switching operations of corresponding high-side switches and low-side switches in said first sub-stage and said second sub-stage, said first arbitration block and said second arbitration block together operate to assign one of a first logic level and a second logic level to said first sub-stage, and to assign the other one of said first logic level and said second logic level to said second sub-stage, wherein the sub-stage assigned the first logic level indicates said twice a magnitude of said corresponding sub-current in odd cycles of said control signal only, and wherein the sub-stage assigned the second logic level indicates said twice a magnitude of said corresponding sub-current in even cycles of said control signal only.

16. The power stage of claim 15, wherein each of said first arbitration block and second arbitration blocks comprises:

a clock generator to generate a clock signal;

a noise generator coupled to receive said clock signal and to generate both a bit of a random binary noise sequence and an inverse of said bit at every cycle of said clock signal;

a first resistor and a first switch coupled in series between said path and a first constant reference potential, said first switch being controlled to be open or closed by said bit;

a second resistor and a second switch coupled in series between said path and a second constant reference potential, said second switch being controlled to be open or closed by said inverse of said bit; and a mid-rail sensor coupled to receive said clock signal and to said path, said mid-rail sensor to determine a voltage on said path at every cycle of said clock signal.

17. The power stage of claim 16, wherein, upon power-up of said power stage and prior to start of switching operations of said corresponding high-side switches and low-side switches, said first arbitration block and said second arbitration block are designed at each cycle of the respective clock signals, to:

generate binary outputs and their complements of the respective random binary noise sequence by the respective noise generators;

close and open the corresponding switches based on said binary outputs and their complements;

measure, using the corresponding mid-rail sensor, a voltage on said path, wherein, if said voltage is not midway between said first constant reference potential and said second constant reference potential, then to repeat said generating, said closing and opening and said measuring, wherein if said voltage is midway between said first constant reference potential and said second constant reference potential, then to assign a respective logic level to each of the first sub-stage and said second sub-stage based on latest values of the binary outputs of said first arbitration block and said second arbitration block, and to cease further operations, wherein said respective logic levels are comprised in said first logic level and said second logic level.

18. The power stage of claim 13, wherein said current-imbalance detector comprises:

a third resistor, a third switch, a fourth switch, a first capacitor, a second capacitor and a comparator, wherein one terminal of said third resistor is coupled to said path, the second terminal of said third resistor being coupled to a first terminal of each of said third switch and said fourth switch, wherein said first capacitor is coupled between a second terminal of said third switch and said second constant reference potential, wherein said second capacitor is coupled between a second terminal of said fourth switch and said second constant reference potential, and wherein a junction of said first capacitor and said second terminal of said third switch is coupled to a first input of said comparator, wherein a junction of said second capacitor and said second terminal of said fourth switch is coupled to a second input of said comparator, wherein an output of said comparator provides a logic signal indicating said result of said comparison.

19. The power stage of claim 18, wherein said modulation circuit comprises:

a P-channel metal oxide semiconductor field effect transistor (PMOS), and an N-channel metal oxide semiconductor field effect transistor (NMOS), a first current source and a second current source, a first inverter and a second inverter, wherein said first inverter is coupled to receive said logic signal and to generate a logical inverse of said logic signal, wherein a magnitude of current flowing through said first current source and said second current source is determined by said logic signal and said logical inverse respectively, wherein said first current source is coupled between said first constant reference potential and a first current terminal of said PMOS, wherein said second current source is coupled between said second constant reference potential and a first current terminal of said NMOS, wherein a second current terminal of said PMOS is coupled to a second current terminal of said NMOS at a junction, said junction being coupled to an input of said second inverter, wherein a control terminal of each of said PMOS and NMOS is coupled to receive said control signal, and wherein an output of said second inverter provides said adjusted control signal.

20. The power stage of claim 19, wherein each of said first sub-stage and said second sub-stage further comprises a detection circuit to compare a threshold voltage with a difference between respective voltages across said first capacitor and said second capacitor, if said difference is greater than said threshold voltage, said detection circuit to assert a second logic signal to indicate that both of said first sub-stage and said second sub-stage are indicating said twice a magnitude of each of said first sub-current and said second sub-current respectively in same cycles of said control signal, wherein each of said first sub-stage and said second sub-stage further comprises:

a flip-flop, a third inverter and an XNOR gate, wherein an output (Q) of said flip-flop is coupled to an input of said third inverter as well as a first one of a pair of inputs of said XNOR gate, wherein an output of said third inverter is used to enable or disable said communication on said path based on a logic level of said output, wherein a second one of said pair of inputs of said XNOR gate is coupled to receive a resynchronize signal representing a logical AND of said second logic signal and a logic level assigned to the corresponding sub-stage, wherein an output of said XNOR gate is coupled to a data (D) input of said flip-flop, wherein a clock input of said flip-flop is coupled to receive said control signal, and wherein a reset input of said flip-flop is coupled to receive an enable signal indicating whether current-balancing is enabled or not, wherein, if said resynchronization signal is a logic high, then an output of said third inverter retains its current state for an immediately next cycle of said control signal, whereby the sub-stage assigned a logic level of one is forced to shift transmitting twice the magnitude of the corresponding sub-current by one cycle of said control signal.

* * * * *